United States Patent
Ranade

(10) Patent No.: US 9,397,165 B2
(45) Date of Patent: Jul. 19, 2016

(54) ACTIVE REGIONS WITH COMPATIBLE DIELECTRIC LAYERS

(71) Applicant: Pushkar Ranade, Hillsboro, OR (US)

(72) Inventor: Pushkar Ranade, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/018,408

(22) Filed: Feb. 8, 2016

(65) Prior Publication Data

US 2016/0172459 A1  Jun. 16, 2016

Related U.S. Application Data

(60) Continuation of application No. 14/624,530, filed on Feb. 17, 2015, now Pat. No. 9,287,364, which is a division of application No. 11/523,105, filed on Sep. 18, 2006, now abandoned.

(51) Int. Cl.
*H01L 29/165*   (2006.01)

(52) U.S. Cl.
CPC ................................... *H01L 29/165* (2013.01)

(58) Field of Classification Search
CPC ...................................................... H01L 29/267
See application file for complete search history.

(56) References Cited

U.S. PATENT DOCUMENTS

| | | |
|---|---|---|
| 3,574,008 A | 4/1971 | Rice |
| 4,566,914 A | 1/1986 | Hall |
| 4,915,744 A | 4/1990 | Ho et al. |
| 4,929,566 A | 5/1990 | Beitman |
| 5,780,343 A | 7/1998 | Bashir |
| 5,915,192 A | 6/1999 | Liaw et al. |
| 5,963,822 A | 10/1999 | Saihara et al. |
| 6,200,879 B1 | 3/2001 | Tyagi |
| 6,228,691 B1 | 5/2001 | Doyle |
| 6,249,025 B1 | 6/2001 | Tyagi |
| 6,352,942 B1 | 3/2002 | Luan et al. |
| 6,372,583 B1 | 4/2002 | Tyagi |
| 6,429,061 B1 | 8/2002 | Rim |
| 6,479,354 B2 | 11/2002 | Moon |
| 6,503,799 B2 | 1/2003 | Horita et al. |
| 6,544,854 B1 | 4/2003 | Puchner et al. |
| 6,583,488 B1 | 6/2003 | Xiang |
| 6,600,170 B1 | 7/2003 | Xiang |
| 6,630,710 B1 * | 10/2003 | Augusto ........... H01L 29/66651 257/327 |
| 6,784,101 B1 | 8/2004 | Yu et al. |
| 6,812,074 B2 | 11/2004 | Wieczorek et al. |

(Continued)

FOREIGN PATENT DOCUMENTS

| | | |
|---|---|---|
| JP | 10-223901 | 8/1998 |
| JP | 10-326750 | 12/1998 |

(Continued)

*Primary Examiner* — Lex Malsawma
(74) *Attorney, Agent, or Firm* — Blakely, Sokoloff, Taylor & Zafman LLP

(57) ABSTRACT

A method to form a semiconductor structure with an active region and a compatible dielectric layer is described. In one embodiment, a semiconductor structure has a dielectric layer comprised of an oxide of a first semiconductor material, wherein a second (and compositionally different) semiconductor material is formed between the dielectric layer and the first semiconductor material. In another embodiment, a portion of the second semiconductor material is replaced with a third semiconductor material in order to impart uniaxial strain to the lattice structure of the second semiconductor material.

20 Claims, 13 Drawing Sheets

(56) References Cited

U.S. PATENT DOCUMENTS

| | | |
|---|---|---|
| 6,924,536 B2 | 8/2005 | Nishiyama et al. |
| 6,955,955 B2 | 10/2005 | Chen et al. |
| 7,078,325 B2 | 7/2006 | Curello et al. |
| 7,078,723 B2 | 7/2006 | Lin et al. |
| 7,202,514 B2 | 4/2007 | Ahmed et al. |
| 7,491,988 B2 * | 2/2009 | Tolchinsky ......... H01L 29/1054 257/192 |
| 7,538,390 B2 | 5/2009 | Wang et al. |
| 2002/0173130 A1 | 11/2002 | Pomerede et al. |
| 2004/0029387 A1 | 2/2004 | Viravaux |
| 2004/0178447 A1 | 9/2004 | Yeo et al. |
| 2005/0224786 A1 | 10/2005 | Lin et al. |
| 2006/0030093 A1 | 2/2006 | Zhang et al. |
| 2006/0046366 A1 | 3/2006 | Orlowski et al. |
| 2006/0065914 A1 | 3/2006 | Chen et al. |
| 2007/0132034 A1 | 6/2007 | Curello et al. |

FOREIGN PATENT DOCUMENTS

| | | |
|---|---|---|
| JP | 200077658 | 3/2000 |
| JP | 2001-267555 | 9/2001 |
| WO | WO-2006023219 | 3/2006 |

* cited by examiner

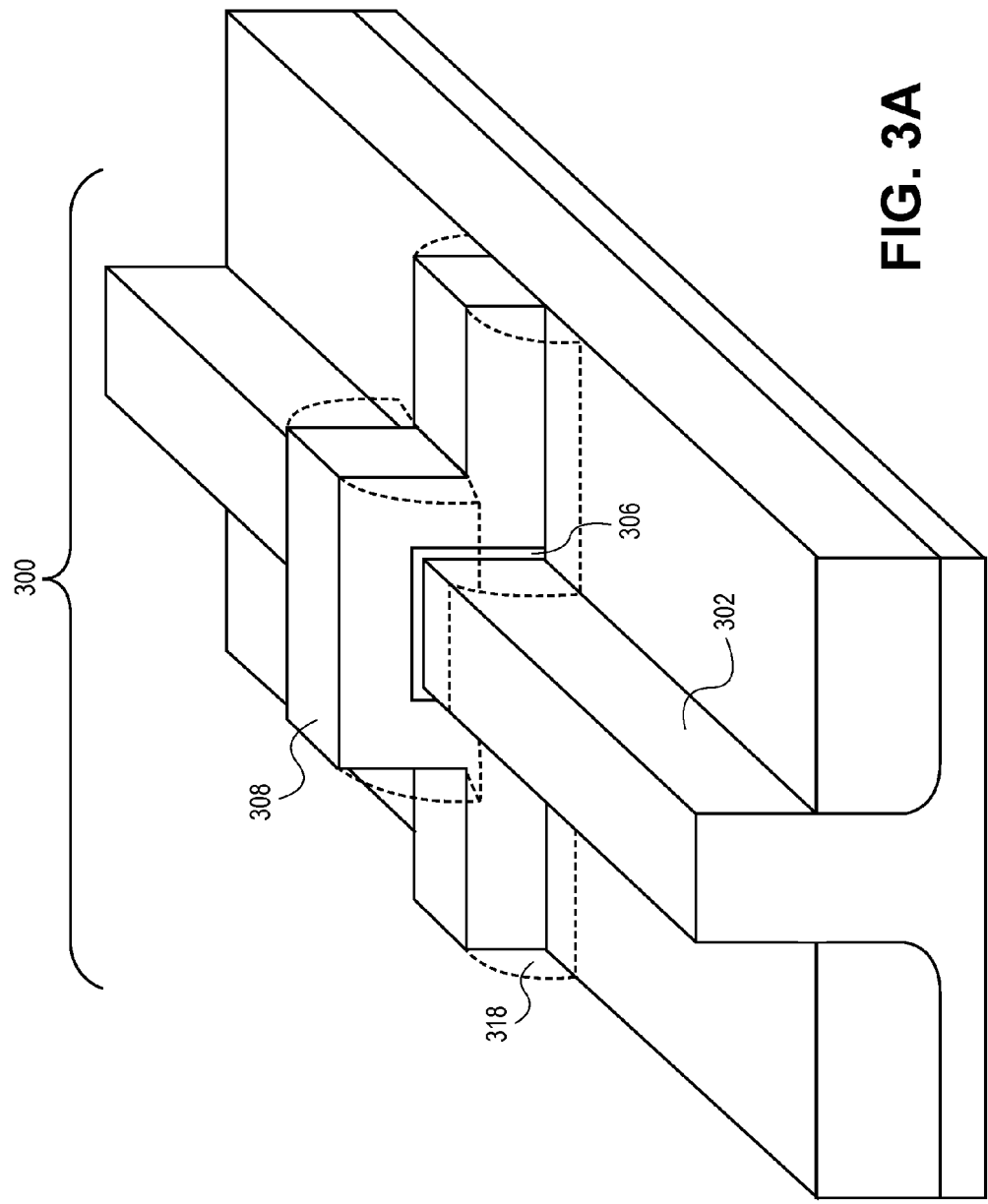

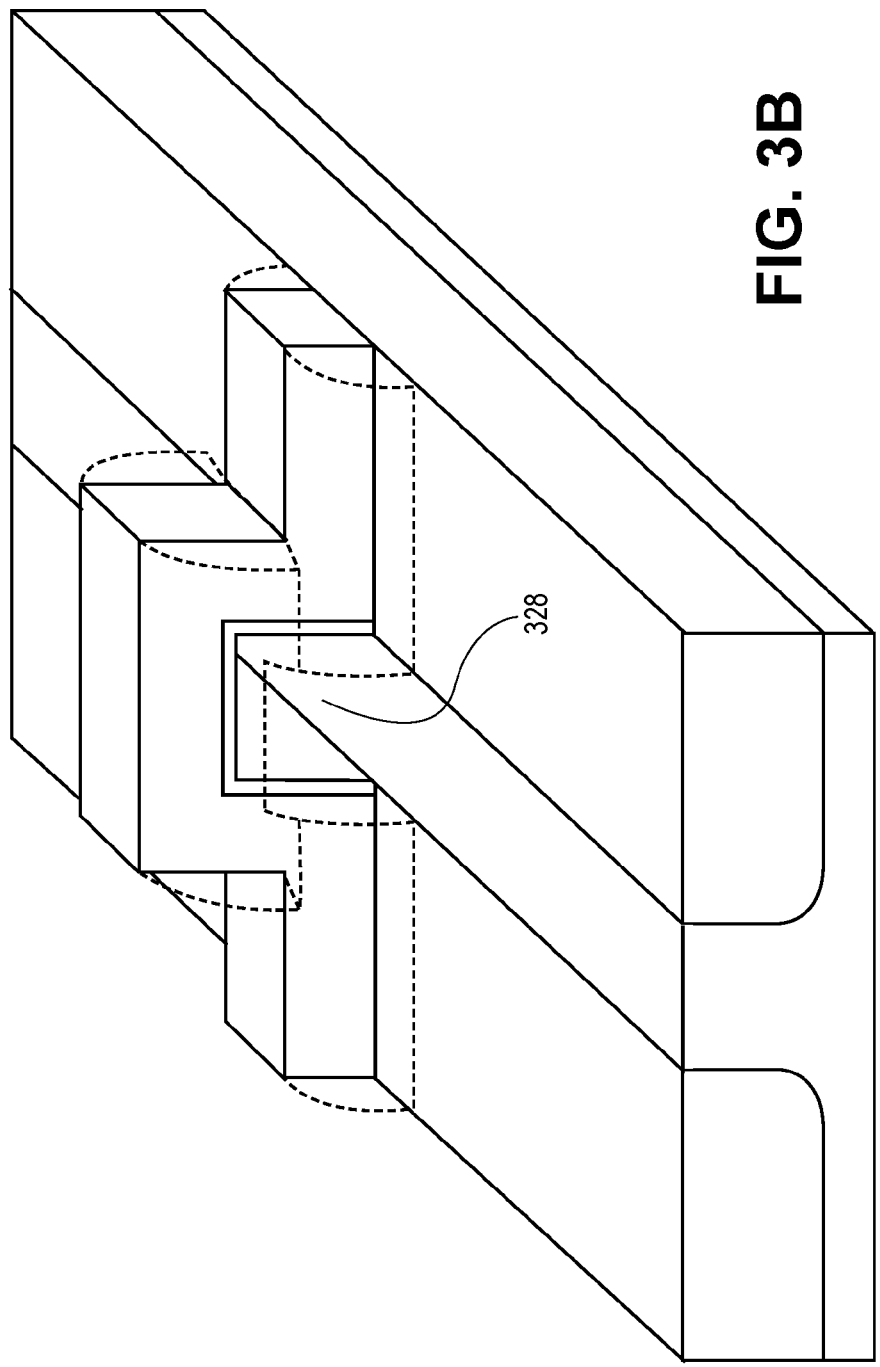

ACTIVE REGIONS WITH COMPATIBLE DIELECTRIC LAYERS

CROSS-REFERENCE TO RELATED APPLICATIONS

This application is a continuation of U.S. patent application Ser. No. 14/624,530, filed on Feb. 17, 2015, which is a divisional of U.S. patent application Ser. No. 11/523,105, filed on Sep. 18, 2006, the entire contents of which are hereby incorporated by reference herein.

BACKGROUND OF THE INVENTION

1) Field of the Invention

The invention is in the field of Semiconductor Structures.

2) Description of Related Art

For the past several decades, semiconductor devices such as Metal Oxide Semiconductor Field-Effect Transistors (MOS-FETs) have been fabricated using doped crystalline silicon for active regions, e.g. channel regions, and amorphous silicon dioxide for dielectric regions, e.g. gate dielectric layers. The beauty of the silicon/silicon dioxide pairing is that the silicon dioxide can be formed directly on the surface of a crystalline silicon substrate via heating the substrate in the presence of oxygen. The process is very controllable and can reliably provide silicon dioxide films as thin as 2-3 monolayers thick.

In the drive for ever-faster semiconductor devices, however, it may be desirable to utilize a channel material other than crystalline silicon. One caveat is that very few other semiconductor materials, if any, form as compatible a surface amorphous oxide layer as does the crystalline silicon/silicon dioxide pairing. This has made the utilization of channel materials other than silicon quite daunting. Thus, a method to form active regions with compatible dielectric layers, and the resultant structures, is described herein.

BRIEF DESCRIPTION OF THE DRAWINGS

FIGS. 3A-C illustrate cross-sectional views representing the formation of a tri-gate MOS-FET having active regions with compatible dielectric layers, in accordance with an embodiment of the present invention.

DETAILED DESCRIPTION

Figure 1A:
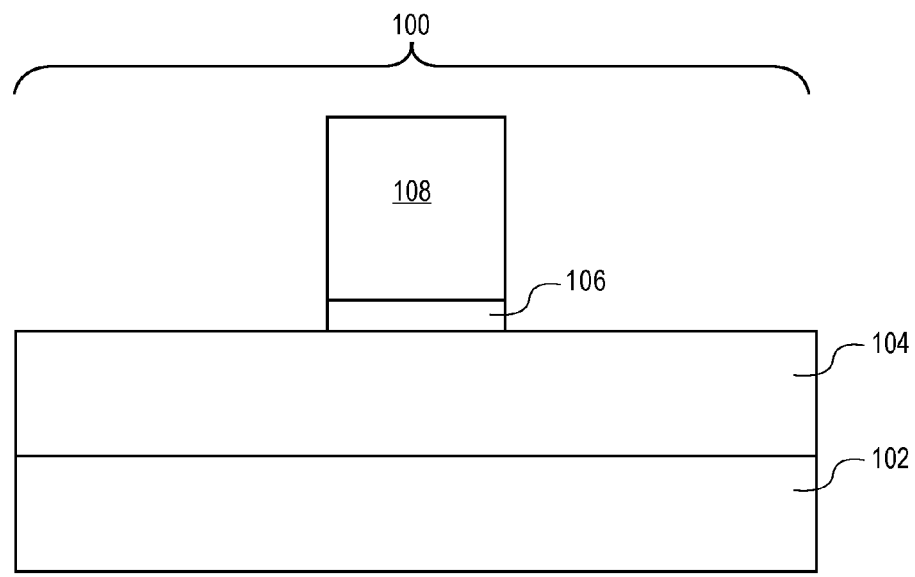
FIGS. 1A-B illustrate cross-sectional views representing semiconductor structures having active regions with compatible dielectric layers, in accordance with an embodiment of the present invention.

A process for fabricating semiconductor devices, and the resultant devices, is described. In the following description, numerous specific details are set forth, such as specific dimensions and chemical regimes, in order to provide a thorough understanding of the present invention. It will be apparent to one skilled in the art that the present invention may be practiced without these specific details. In other instances, well-known processing steps, such as patterning steps or wet chemical cleans, are not described in detail in order to not unnecessarily obscure the present invention. Furthermore, it is understood that the various embodiments shown in the figures are illustrative representations and are not necessarily drawn to scale.

Disclosed herein are semiconductor structures having active regions with compatible dielectric layers and methods to form the same. Controlled thermal or native growth of an oxide, via consumption of the top surface of a semiconductor substrate in an oxidation process, can provide a reliable dielectric layer. However, it may be desirable to retain the reliable dielectric layer, yet replace the portion of the semiconductor substrate directly under the reliable dielectric layer with a different semiconductor material. This subsequent replacement of a portion of the semiconductor substrate with a different semiconductor material directly below the dielectric layer may enable the formation of a new active region with a reliable dielectric layer. Thus, a structure may be formed wherein a dielectric layer comprising an oxide of a first semiconductor material is retained directly above a second, and different, semiconductor material. This process and the resulting structure can be particularly beneficial in cases where the oxide of the second semiconductor material has inferior characteristics to the oxide of the first semiconductor material, but incorporation of the second semiconductor material is nonetheless desirable. Furthermore, a portion of the second semiconductor material may be replaced with a third semiconductor material in order to impart uniaxial strain to the lattice structure of the second semiconductor material. The combination of incorporating an optimal semiconductor material to form an active region and applying uniaxial strain to that active region can lead to increased charge carrier mobility in the channel region of a semiconductor device. Thus, optimization of high performance semiconductor devices may be achieved.

The controlled consumption of the top surface of a semiconductor substrate via an oxidation process can provide a reliable (i.e. uniform thickness and consistent composition) dielectric layer on the surface of that substrate. For example, thermal or native growth of silicon dioxide on the surface of a crystalline silicon substrate provides a reliable dielectric layer as thin as 3-10 Angstroms (i.e. 1-3 monolayers). The resulting oxide layer may be used as a gate dielectric layer, or a component thereof, in a semiconductor device. In accordance with an embodiment of the present invention, a silicon dioxide layer is formed on the surface of a crystalline silicon substrate by heating the crystalline silicon substrate in the presence of an oxidizing agent, such as $O_2$, $H_2O$, or $O_3$. In accordance with an alternative embodiment of the present invention, a native layer of silicon dioxide is formed upon exposure of a crystalline silicon substrate to a water pulse in an atomic layer deposition (ALD) chamber. A bi-layer dielectric layer can be formed by depositing a layer of a high-K dielectric material directly above the native silicon dioxide layer.

In some applications, a crystalline silicon substrate may not be the most desirable material for use as an active region (e.g. a channel region) in a semiconductor device. For example, in accordance with an embodiment of the present invention, it is desirable to use germanium as the channel material in a P-type device, while it is desirable to use a III-V material as the channel material in an N-type device. In another embodiment, one of germanium or a III-V material is used for both the P-type device and the N-type device. By incorporating these channel materials into such devices, the hole mobility and the electron mobility, respectively, may be optimized for improved device performance. However, the oxidation of the surfaces of germanium and III-V materials tends to provide oxide layers that are unstable and/or nonuniform in thickness or composition. It may therefore be desirable to combine a semiconductor material with an oxide layer of a different semiconductor material. Thus, in accordance with an embodiment of the present invention, a semiconductor material that would otherwise provide an inferior oxide layer is combined with a reliable oxide layer, wherein the oxide layer is an oxide of a different semiconductor material.

In order to provide a semiconductor structure comprising a second semiconductor material in combination with an oxide layer of a first semiconductor material, a replacement approach may be utilized. In effect, the oxide layer may be formed above a first semiconductor material, a portion of which is then removed to form a trench between the oxide layer and the first semiconductor material. A second semiconductor material may then be formed in the trench. Thus, in accordance with an embodiment of the present invention, a portion of a semiconductor substrate comprised of a first semiconductor material is replaced with a second semiconductor material (i.e. an active region) directly between a pre-formed oxide layer and the semiconductor substrate.

A semiconductor region formed on or in a crystalline semiconductor material may impart a strain to the crystalline semiconductor material, and hence may be a strain-inducing semiconductor region, if the lattice constant of the semiconductor region is different from the lattice constant of the crystalline semiconductor material. The lattice constants are based on the atomic spacings and the unit cell orientations within each of the semiconductor region and the crystalline semiconductor material. Thus, a semiconductor region comprising different species of lattice-forming atoms than the crystalline semiconductor material may impart a strain to the crystalline semiconductor material. For example, in accordance with an embodiment of the present invention, a semiconductor region that comprises only silicon lattice-forming atoms imparts a strain to a crystalline semiconductor material comprised of germanium lattice-forming atoms. Furthermore, a semiconductor region comprising the same species of lattice-forming atoms as the crystalline semiconductor material, but wherein the species of lattice-forming atoms are present in different stoichiometric concentrations, may impart a strain to the crystalline semiconductor material. For example, in accordance with an embodiment of the present invention, a semiconductor region that comprises $Si_xGe_{1-x}$ lattice-forming atoms (where 0<x<1) imparts a strain to a crystalline semiconductor material comprised of $Si_yGe_{1-y}$ lattice-forming atoms (where 0<y<1, and x≠y).

Figure 1B:
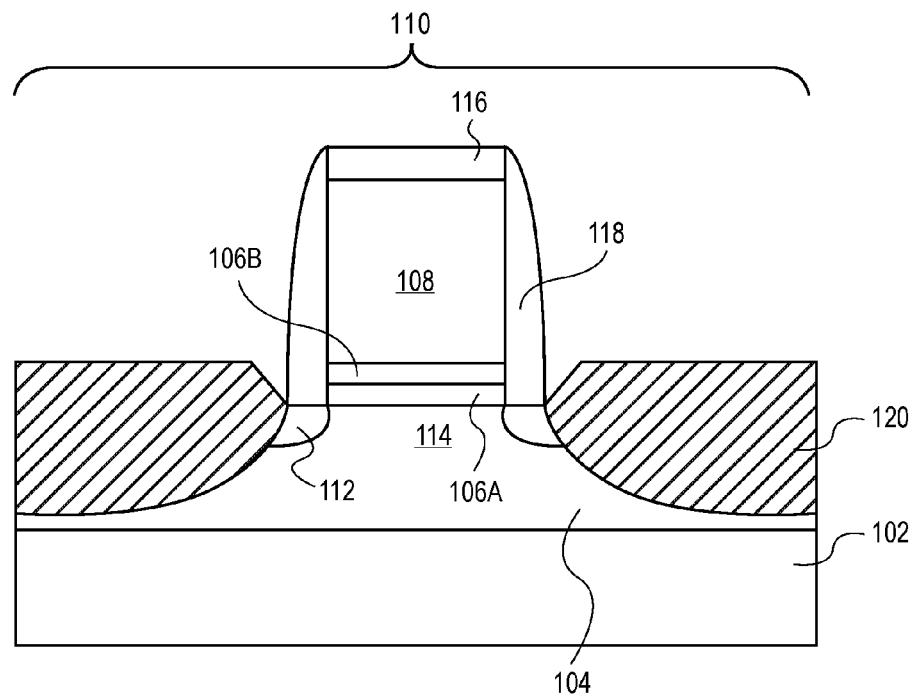

As an example of an embodiment of the present invention, FIGS. 1A-B illustrate cross-sectional views representing semiconductor structures having active regions with compatible dielectric layers. Referring to FIG. 1A, a semiconductor structure 100 is comprised of a substrate 102, which is comprised of a first semiconductor material. An active region 104 is above substrate 102 and the active region is comprised of a second semiconductor material. In accordance with an embodiment of the present invention, the composition (i.e. the atomic make-up) of the second semiconductor material is different for that of the first semiconductor material. A dielectric layer 106 is directly above active region 104 and may comprise a layer of oxide of the first semiconductor material. A conductive region 108 is above dielectric layer 106, which isolates conductive region 108 from active region 104.

Substrate 102 may comprise any semiconductor material that can withstand a manufacturing process. In an embodiment, substrate 102 is comprised of a crystalline silicon or silicon/germanium layer doped with a charge carrier, such as but not limited to phosphorus, arsenic, boron or a combination thereof. In one embodiment, the concentration of silicon atoms in substrate 102 is greater than 97%. In another embodiment, substrate 102 is comprised of an epitaxial layer grown atop a distinct crystalline substrate, e.g. a silicon epitaxial layer grown atop a boron-doped bulk silicon monocrystalline substrate. Substrate 102 may comprise an insulating layer in between a bulk crystal substrate and an epitaxial layer to form, for example, a silicon-on-insulator substrate. In an embodiment, the insulating layer is comprised of a material selected form the group consisting of silicon dioxide, silicon nitride, silicon oxy-nitride or a high-k dielectric layer.

Active region 104 may comprise any semiconductor material in which charges can migrate. In an embodiment, active region 104 is comprised of a III-V material such as, but not limited to, gallium nitride, gallium phosphide, gallium arsenide, indium phosphide, indium antimonide, indium gallium arsenide, aluminum gallium arsenide, indium gallium phosphide or a combination thereof. In another embodiment, active region 104 is comprised of germanium or silicon/germanium with an atomic concentration of germanium atoms greater than 5%. Active region 104 may incorporate charge-carrier dopant impurity atoms. In one embodiment, active region 104 is a crystalline silicon/germanium active region of the stoichiometry $Si_xGe_{1-x}$, where 0≤x≤1, and the charge-carrier dopant impurity atoms are selected from the group consisting of boron, arsenic, indium or phosphorus. In another embodiment, active region 104 is comprised of a III-V material and the charge-carrier dopant impurity atoms are selected from the group consisting of carbon, silicon, germanium, oxygen, sulfur, selenium or tellurium.

Dielectric layer 106 may comprise any dielectric material suitable to insulate a conductive region 108 from active region 104. Furthermore, dielectric layer 106 may comprise a layer of oxide of a semiconductor material different than that of the semiconductor material of active region 104. In an embodiment, dielectric layer 106 is comprised of an oxide of a semiconductor material. In one embodiment, dielectric layer 106 is comprised of silicon dioxide or silicon oxy-nitride. In an embodiment, dielectric layer 106 is comprised of an oxide layer of the semiconductor material of substrate 102. In a specific embodiment, substrate 102 is comprised of silicon and dielectric layer 106 is comprised of silicon dioxide or silicon oxy-nitride. In an embodiment, dielectric layer 106 is comprised of an oxide layer that is directly above active region 104. In one embodiment, dielectric layer 106 is comprised of an oxide layer of the semiconductor material of substrate 102, active region 104 is comprised of a semiconductor material different from the semiconductor material of substrate 102, and the oxide layer of dielectric layer 106 is directly on the top surface of active region 104. In a specific embodiment, dielectric layer 106 is comprised of a silicon dioxide or silicon oxy-nitride, substrate 102 is comprised of silicon, and active region 104 is comprised of germanium or a III-V material. Alternatively, dielectric layer 106 may be comprised of a high-K dielectric layer. In one embodiment, the high-K dielectric layer is selected from the group consisting of hafnium oxide, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate or a combination thereof.

Conductive region 108 may comprise any material suitable to conduct a current. In an embodiment, conductive region 108 is comprised of doped polycrystalline silicon. In another embodiment, conductive region 108 is comprised of a metal layer such as, but not limited to, metal nitrides, metal carbides, metal silicides, hafnium, zirconium, titanium, tantalum, aluminum, ruthenium, palladium, platinum, cobalt, nickel or conductive metal oxides, e.g. ruthenium oxide.

Referring to FIG. 1B, additional features useful for the fabrication of a semiconductor device 110 may be incorporated into semiconductor structure 100. A pair of tip extensions 112 are formed in active region 104 and are separated by a channel region 114, which comprises a portion of active region 104. Conductive region 108 may be a gate electrode, the top surface of which may be protected by a gate electrode protection layer 116 and the sidewalls of which are protected by a pair of gate isolations spacers 118. The pair of gate isolation spacers 116 is above the pair of tip extensions 112. A pair of source/drain regions 120 is formed in active region 104 on either side of gate isolation spacers 118. The pair of source/drain regions 120 may be raised above the top surface of active region 104, as depicted in FIG. 1B. Dielectric layer 106 may be a gate dielectric layer and may be comprised of two distinct dielectric layers, a lower layer 106A and an upper layer 106B, also depicted in FIG. 1B.

The pair of tip extensions 112 may comprises portions of active region 104 that incorporate charge-carrier dopant impurity atoms. In one embodiment, active region 104 is a crystalline silicon/germanium active region of the stoichiometry $Si_xGe_{1-x}$, where $0 \leq x \leq 1$, and the charge-carrier dopant impurity atoms are selected from the group consisting of boron, arsenic, indium or phosphorus. In another embodiment, active region 104 is comprised of a III-V material and the charge-carrier dopant impurity atoms are selected from the group consisting of carbon, silicon, germanium, oxygen, sulfur, selenium or tellurium.

Gate electrode protection layer 116 and the pair of gate isolation spacers 118 may comprise any materials suitable to isolate gate electrode. The same species of material, however, need not be used for both gate electrode protection layer 116 and gate isolation spacers 118. In an embodiment, gate electrode protection layer 116 and gate isolation spacers 118 are comprised of insulating materials. In a particular embodiment, gate electrode protection layer 116 and gate isolation spacers 118 are comprised of a material selected from the group comprising silicon dioxide, silicon oxy-nitride, carbon-doped silicon oxide, silicon nitride, carbon-doped silicon nitride or a combination thereof.

The pair of source/drain regions 120 may comprises portions of active region 104 that incorporate charge-carrier dopant impurity atoms. In one embodiment, active region 104 is a crystalline silicon/germanium active region of the stoichiometry $Si_xGe_{1-x}$, where $0 \leq x \leq 1$, and the charge-carrier dopant impurity atoms are selected from the group consisting of boron, arsenic, indium or phosphorus. In another embodiment, active region 104 is comprised of a III-V material and the charge-carrier dopant impurity atoms are selected from the group consisting of carbon, silicon, germanium, oxygen, sulfur, selenium or tellurium. Alternatively, the pair of source/drain regions 120 may comprise a semiconductor material that is different from the semiconductor material of active region 104. In an embodiment, the lattice-constant of the semiconductor material of source/drain region is different from the lattice-constant of the semiconductor material of active region 104 and, thus, the pair of source/drain regions 120 is a pair of uniaxial strain-inducing source/drain regions. In one embodiment, active region 104 is comprised of $Si_xGe_{1-x}$ and the pair of source/drain regions 120 is comprised of $Si_yGe_{1-y}$, where $0 \leq x$, $y \leq 1$ and $x \neq y$. In another embodiment, active region 104 is comprised of $Al_xGa_{1-x}As$, $In_xGa_{1-x}As$, $In_xGa_{1-x}P$ or $Al_xIn_{1-x}Sb$ and the pair of source/drain regions 120 is comprised of $Al_yGa_{1-y}As$, $In_yGa_{1-y}As$, $In_yGa_{1-y}P$ or $Al_yIn_{1-y}Sb$, respectively, where $0 \leq x$, $y \leq 1$ and $x \neq y$.

Dielectric layer 106 may be comprised of two distinct dielectric layers, a lower layer 106A and an upper layer 106B. In an embodiment, lower layer 106A is comprised of comprised of an oxide of a semiconductor material. In one embodiment, lower layer 106A is comprised of silicon dioxide or silicon oxy-nitride. In an embodiment, lower layer 106A is comprised of an oxide layer of the semiconductor material of substrate 102. In a specific embodiment, substrate 102 is comprised of silicon and lower layer 106A is comprised of silicon dioxide or silicon oxy-nitride. In an embodiment, lower layer 106A is comprised of an oxide layer that is directly above active region 104. In one embodiment, lower layer 106A is comprised of an oxide layer of the semiconductor material of substrate 102, active region 104 is comprised of a semiconductor material different from the semiconductor material of substrate 102, and lower layer 106A is directly on the top surface of active region 104. In a specific embodiment, lower layer 106A is comprised of a silicon dioxide or silicon oxy-nitride, substrate 102 is comprised of silicon, and active region 104 is comprised of germanium or a III-V material. In an embodiment, upper layer 106B is comprised of silicon dioxide or silicon oxy-nitride. In an alternative embodiment, upper layer 106B is comprised of a high-K dielectric layer. In one embodiment, the high-K dielectric layer is selected from the group consisting of hafnium oxide, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate or a combination thereof. In a particular embodiment, semiconductor substrate 102 is comprised of silicon, lower layer 106A is comprised of silicon dioxide or silicon oxy-nitride, and upper layer 106B is comprised of a high-K dielectric layer.

Figure 2A:
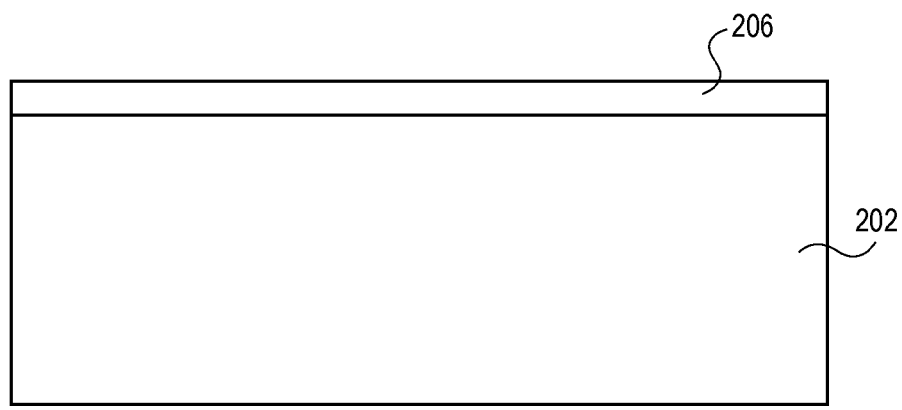
FIGS. 2A-N illustrate cross-sectional views representing the formation of a planar MOS-FET having active regions with compatible dielectric layers, in accordance with an embodiment of the present invention.
Figure 2A:
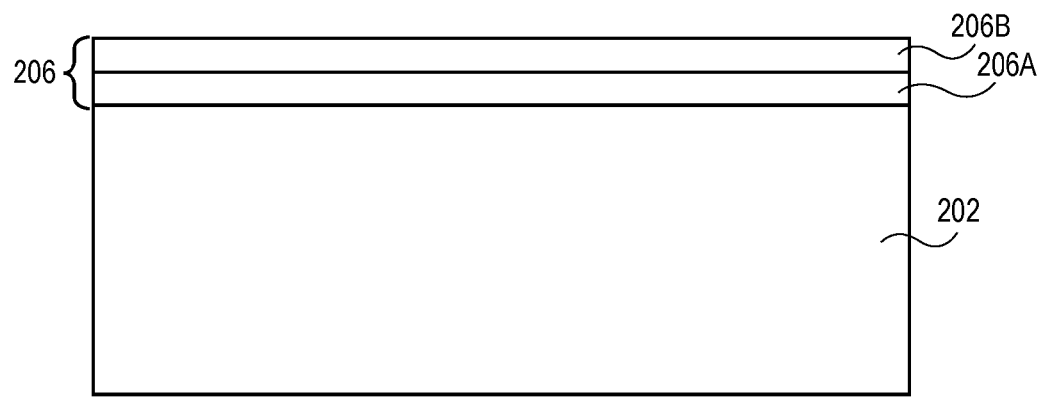

Semiconductor structures having active regions with compatible dielectric layers may be used to form semiconductor devices. In one embodiment, the semiconductor device is a planar MOS-FET, a memory transistor or a micro-electronic machine (MEM). In another embodiment, the semiconductor device is a non-planar device, such as a tri-gate or FIN-FET transistor, an independently-accessed double-gated MOS-FET, or a gate-all-around MOS-FET with a nanowire channel. FIGS. 2A-N illustrate cross-sectional views representing the formation of a planar MOS-FET having active regions with compatible dielectric layers, in accordance with an embodiment of the present invention. In one embodiment, such a process enables the formation of a high quality dielectric layer (comprising an oxide of a first semiconductor material) on an active region (i.e. the second, replacement semiconductor material) comprised of a semiconductor material that does not typically yield an oxide of high quality. As will be appreciated in the typical integrated circuit, both N- and P-channel transistors may be fabricated in a single substrate or epitaxial layer to form a CMOS integrated circuit.

Referring to FIG. 2A, a gate dielectric layer 206 is formed above a substrate 202. Substrate 202 may comprise any material discussed in association with substrate 102 from FIGS. 1A-B. Likewise, gate dielectric layer 206 may comprise any material discussed in association with dielectric layer 106 from FIG. 1A. Gate dielectric layer 206 may be formed from an oxide of substrate 202 by any technique suitable to provide a reliable (i.e. uniform composition and thickness) dielectric layer above the top surface of substrate 202. In accordance with an embodiment of the present invention, gate dielectric layer 206 is formed by consuming a portion of the top surface of substrate 202. In one embodiment, gate dielectric layer 206 is formed by oxidizing the top surface of substrate 202 to form an oxide layer comprised of an oxide of the semiconductor material of substrate 202. In a particular embodiment, gate dielectric layer 206 is formed by heating substrate 202 in the presence of an oxidizing agent, such as $O_2$, $H_2O$ or $O_3$, until a desired thickness of an oxide layer is formed. In a specific embodiment, substrate 202 is comprised of silicon, gate dielectric layer 206 is comprised of a layer of silicon dioxide, the formation of the layer of silicon dioxide is carried out at a temperature in the range of 600-800 degrees Celsius for a duration in the range of 1 minute-1 hour, and the layer of silicon dioxide is formed to a thickness in the range of 5-15 Angstroms. In another embodiment, gate dielectric layer 206 is formed by oxidizing the top surface of substrate 202 in the presence of a nitrogen-containing gas to form an oxy-nitride layer comprised of an oxy-nitride of the semiconductor material of substrate 202. In a particular embodiment, gate dielectric layer 206 is formed by heating substrate 202 in the presence of an oxidizing agent, such as $O_2$, $H_2O$ or $O_3$, and ammonia until a desired thickness of an oxy-nitride layer is formed. In a specific embodiment, substrate 202 is comprised of silicon, gate dielectric layer 206 is comprised of a layer of silicon oxy-nitride, the formation of the layer of silicon oxy-nitride is carried out at a temperature in the range of 600-800 degrees Celsius for a duration in the range of 1 minute-1 hour, and the layer of silicon oxy-nitride is formed to a thickness in the range of 5-15 Angstroms. In an alternative embodiment, gate dielectric layer 206 is formed by a deposition process. In one embodiment, the deposition process is selected from the group consisting of a chemical vapor deposition process, an atomic layer deposition process or a physical vapor deposition process.

Referring to FIG. 2A', gate dielectric layer 206 may be comprised of two distinct dielectric layers, a lower layer 206A and an upper layer 206B. Lower layer 206A and upper layer 206B of gate dielectric layer 206 may comprise any material discussed in association with lower layer 106A and upper layer 106B from FIG. 1B. In accordance with an embodiment of the present invention, subsequent to the formation of lower layer 206A comprised of an oxide or oxy-nitride layer above substrate 202 (as discussed above), upper layer 206B may be formed above lower layer 206A. Upper layer 206B may be formed by any technique suitable to provide a reliable (i.e. uniform composition and thickness) dielectric layer above the top surface of lower layer 206A. In an embodiment, upper layer 206B is formed by a deposition process. In one embodiment, the deposition process is selected from the group consisting of a chemical vapor deposition process, an atomic layer deposition process or a physical vapor deposition process. In an alternative embodiment, gate dielectric layer 206 comprising two distinct dielectric layers, i.e. lower layer 206A and an upper layer 206B, may be formed in a single process step (i.e. in a single reaction chamber without requiring multiple introductions of substrate 202 into the reaction chamber). In one embodiment, a native layer of oxide (i.e. lower layer 206A) is formed upon exposure of substrate 202 to a water pulse in an atomic layer deposition (ALD) chamber. An upper layer 206B of a dielectric material may then be deposited above the native oxide layer by a sequencing of dielectric precursor introductions into the ALD chamber. In a particular embodiment, substrate 202 is comprised of silicon, lower layer 206A is a native silicon dioxide layer with a thickness in the range of 3-10 Angstroms, and upper layer 206B is a high-K dielectric layer selected from the group consisting of hafnium oxide, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate or a combination thereof.

Figure 2B:
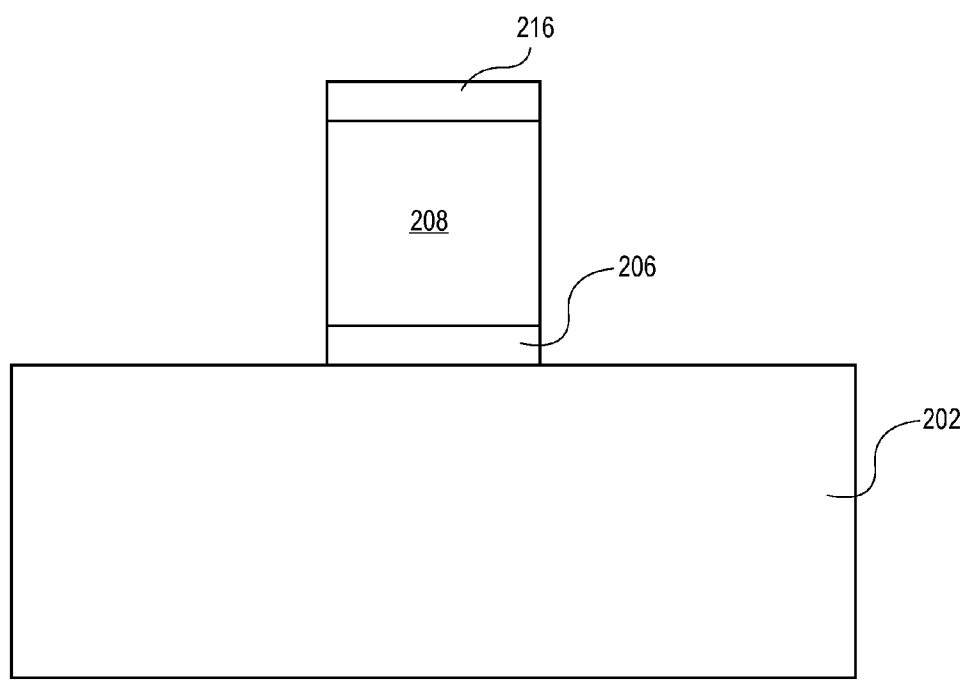

A gate electrode 208 may then be formed above gate dielectric layer 206, as depicted in FIG. 2B. For illustrative purposes, gate dielectric layer 206 is depicted as a single layer film (i.e. as illustrated in FIG. 2A), but it should be understood that it may comprise more than one layer, as discussed in association with FIG. 2A'. Gate electrode 208 may comprise any material discussed in association with conductive region 108 from FIGS. 1A-B. Gate electrode 208 may be formed by any technique suitable to provide a conductive region above the top surface of gate dielectric layer 206 without detrimentally impacting gate dielectric layer 206. In accordance with an embodiment of the present invention, gate electrode 208 is formed by depositing a blanket film and then subsequently patterning the blanket film to form a conductive structure of a desired shape and dimension. In one embodiment, gate dielectric layer 206 is also patterned during the patterning of gate electrode 208 to expose the top surface of substrate 202, as depicted in FIG. 2B. In a specific embodiment, gate dielectric layer 206 is patterned with a wet chemical cleaning process step that comprises the application of an aqueous solution of hydrofluoric acid, ammonium fluoride or both. A gate electrode protection layer 216 may be formed above gate electrode 208, also depicted in FIG. 2B. Gate electrode protection layer 216 may comprise any material discussed in association with gate electrode protection layer 116 from FIG. 1B. In accordance with an embodiment of the present invention, gate electrode protection layer 216 is an artifact from the patterning process steps used to for gate electrode 208. In an alternative embodiment, gate electrode isolation layer 216 is formed post-patterning above gate electrode 208 by a chemical vapor deposition process.

Figure 2C:
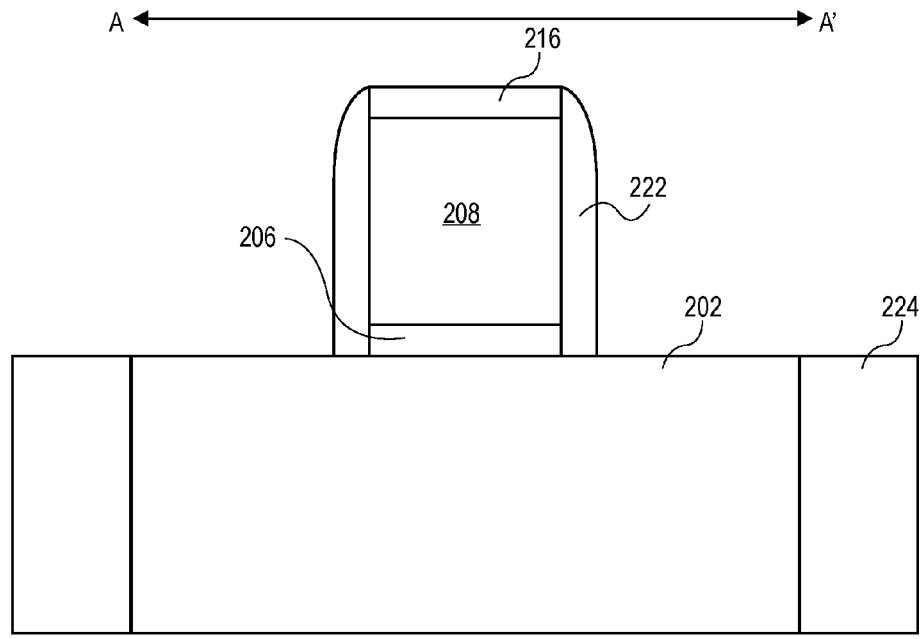
Figure 2C:
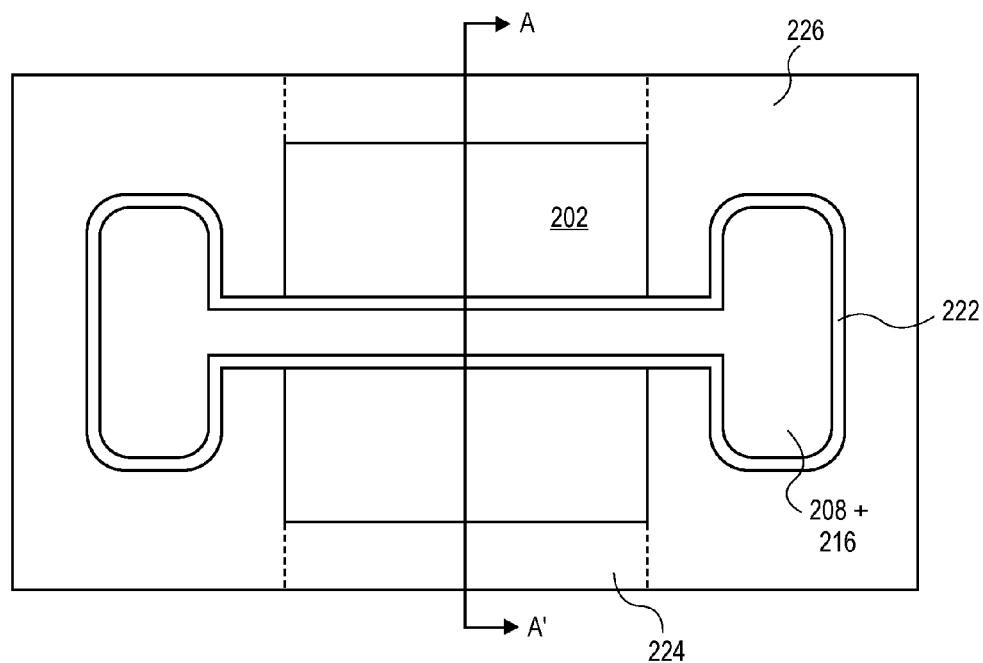

Referring to FIG. 2C, a pair of sacrificial gate isolation spacers 222 may be formed adjacent the sidewalls of gate electrode 208. Sacrificial gate isolation spacers 222 may comprise any material discussed in association with gate isolation spacers 118 from FIG. 1B. In accordance with an embodiment of the present invention, sacrificial gate isolation spacers 222 are used to protect gate electrode 208 during the subsequent substrate etch step discussed below. Thus, in an alternative embodiment, gate electrode 208 is robust against the substrate etch step and a pair of sacrificial gate isolation spacers 222 is not required. The pair of sacrificial gate isolation spacers 222 may be formed by any technique suitable to provide total coverage of the sidewalls of gate electrode 208. In an embodiment, sacrificial gate isolation spacers 222 are formed by depositing, and subsequently anisotropically etching, a blanked dielectric film. In another embodiment, sacrificial gate isolation spacers 222 are formed by consuming/passivating a portion of gate electrode 208 in an oxidation process.

FIG. 2C is a cross-sectional view along the A-A' axis of the top-down view illustrated in FIG. 2C'. As depicted, shallow-trench isolation regions 224 and 226 may be formed in substrate 202. In accordance with an embodiment of the present invention, in order for gate electrode 208 and underlying gate dielectric layer 206 to remain in tact during a subsequent substrate etch step, shallow-trench isolation region 226 must be present. Isolated devices may also comprise shallow-trench isolation region 224 and this feature will be included onward for illustrative purposes. However, it is to be understood that in the case of nested structures, shallow-trench isolation region 224 need not be present and substrate 202 may be extended along the dashed lines shown in FIG. 2C'. As would be apparent to one of ordinary skill in the art, shallow-trench isolation regions 224 and 226 would typically have been formed in substrate 202 prior to the formation of dielectric layer 206. For example, in accordance with an embodiment of the present invention, shallow-trench isolation regions 224 and 226 are formed by filling trenches created in substrate 202 with a dielectric material, e.g. a silicon dioxide material deposited by a chemical vapor deposition process.

Figure 2D:
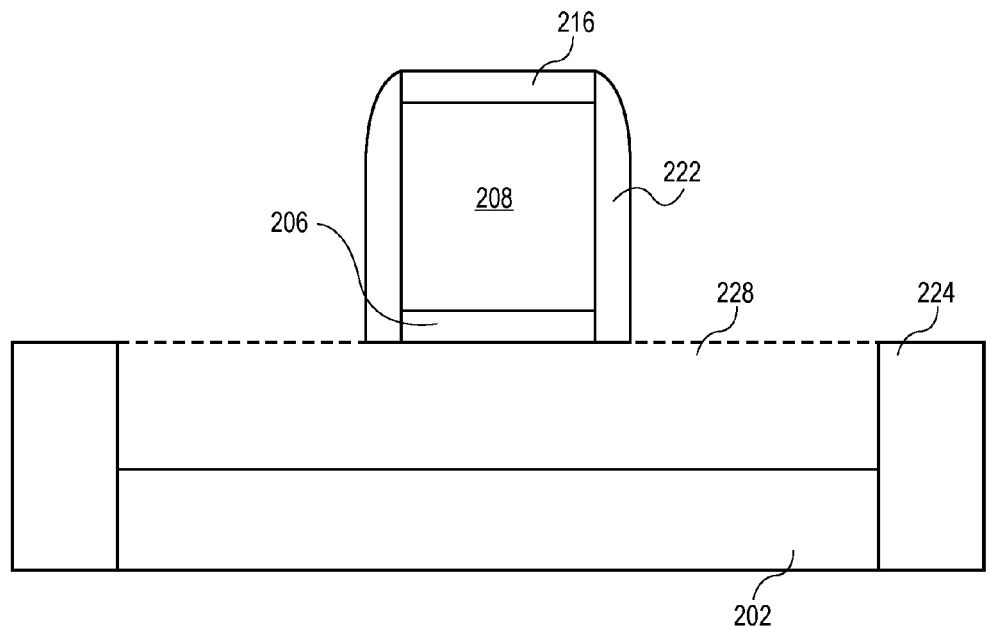
Figure 2D:
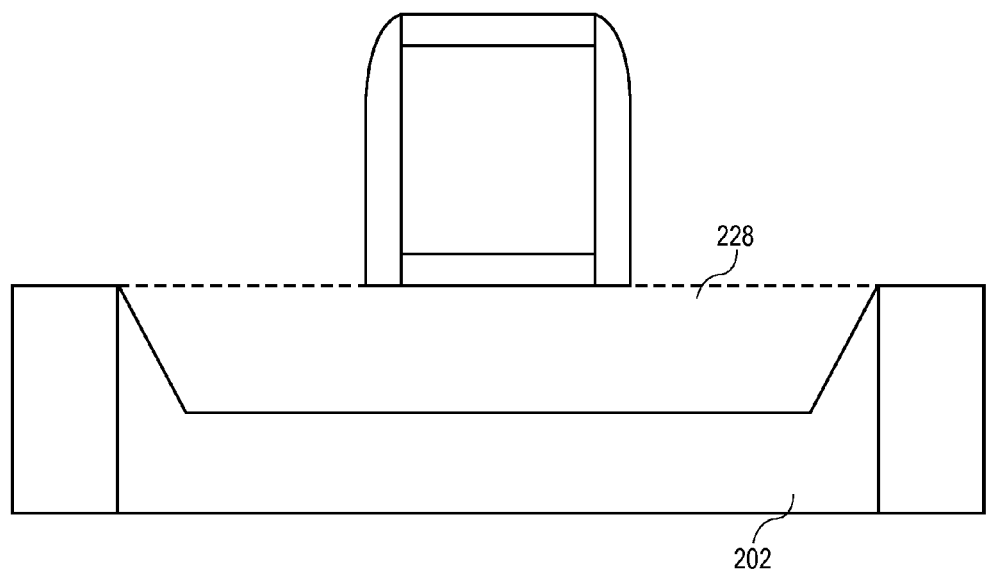

Referring to FIG. 2D, a portion of substrate 202 may be removed to form a trench 228 directly between substrate 202, gate dielectric layer 206, and shallow-trench isolation regions 224. A portion of gate dielectric layer 206, gate electrode 208, sacrificial gate isolation spacers 222 and gate electrode protection layer 216 is suspended over trench 228, but another portion of these structures is secured by shallow-trench isolations regions 226 (shown in FIG. 2C), as depicted by the dashed lines. Trench 228 may be formed by any technique suitable to selectively remove a portion of substrate 202 without significantly impacting gate dielectric layer 206 or gate electrode 208, such as a dry etch or a wet etch process. In accordance with an embodiment of the present invention, gate electrode protection layer 216 and sacrificial gate isolation spacers 222 protect gate electrode 208 during the formation of trench 208. In one embodiment, trench 228 is formed by a dry plasma etch step utilizing gases selected from the group consisting of $NF_3$, HBr, $SF_6$/Cl or $Cl_2$. In a specific embodiment, portions of substrate 202 are removed uniformly, leaving a trench 228 with equal depth in all locations, as depicted in FIG. 2D. In another embodiment, a wet etch step utilizing aqueous solutions of $NH_4OH$ or tetramethylammonium hydroxide is used to form trench 228. In one embodiment, these wet etchants are inhibited by high density planes of substrate 202 (e.g. the <111> plane in a silicon substrate), and trench 228 thus assumes a tapered profile, as depicted in FIG. 2D'. In a specific embodiment, trench 228 is formed by applying an aqueous solution of $NH_4OH$ with a concentration in the range of 10-30% at a temperature in the range of 20-35 degrees Celsius to a substrate 202 comprised of crystalline silicon and a tapered profile results with a surface angle of 55 degrees. For illustrative purposes, however, the uniform trench 228 of FIG. 2D is shown in subsequent steps. Trench 228 may be formed to a depth sufficient to remove all channel activity from substrate 202 and/or sufficient to accommodate source/drain regions comprised of a different semiconductor material, as discussed below. In one embodiment, trench 228 is formed to a depth in the range of 800-1200 Angstroms.

Figure 2E:
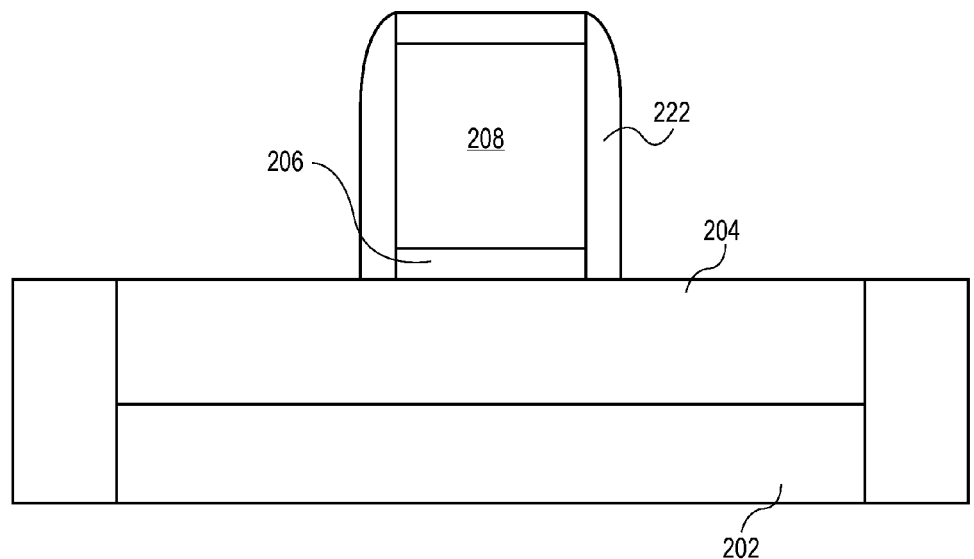

Referring to FIG. 2E, active region 204 is formed in trench 228, directly between substrate 202 and gate dielectric layer 206. Active region 204 may be comprised of any material discussed in association with active region 104 from FIGS. 1A-B. Additionally, active region 204 may incorporate charge-carrier dopant impurity atoms. In one embodiment, active region 204 is a crystalline silicon/germanium active region of the stoichiometry $Si_xGe_{1-x}$, where $0 \leq x \leq 1$, and the charge-carrier dopant impurity atoms are selected from the group consisting of boron, arsenic, indium or phosphorus. In another embodiment, active region 204 is comprised of a III-V material and the charge-carrier dopant impurity atoms are selected from the group consisting of carbon, silicon, germanium, oxygen, sulfur, selenium or tellurium. In accordance with an embodiment of the present invention, active region 204 is comprised of a semiconductor material with a composition different than the semiconductor material of substrate 202 and is compatible with dielectric layer 206.

Active region 204 may be formed by any technique suitable to form a highly uniform (i.e. low surface defect density, e.g. less than $10^6$ dislocations/$cm^2$ at the surface of active region 204) crystalline layer. In one embodiment, active region 204 is a uniform epitaxial layer. In another embodiment, active region 204 is a graded epitaxial layer, wherein the grading process minimizes surface defects. In an alternative embodiment, the defect density of active region 204 at the interface of substrate 202 is greater than $10^8$ dislocations/$cm^2$, but at the top surface of active region 204 is less than $10^5$ dislocations/$cm^2$. In an embodiment, active region 204 is deposited by a process selected from the group consisting of chemical vapor epitaxy, molecular-beam epitaxy or laser-abolition epitaxy. In one embodiment, a wet chemical clean is carried out immediately prior to the deposition of active region 204. In a specific embodiment, the wet chemical cleaning process step comprises the application of an aqueous solution of hydrofluoric acid, ammonium fluoride or both.

Figure 2F:
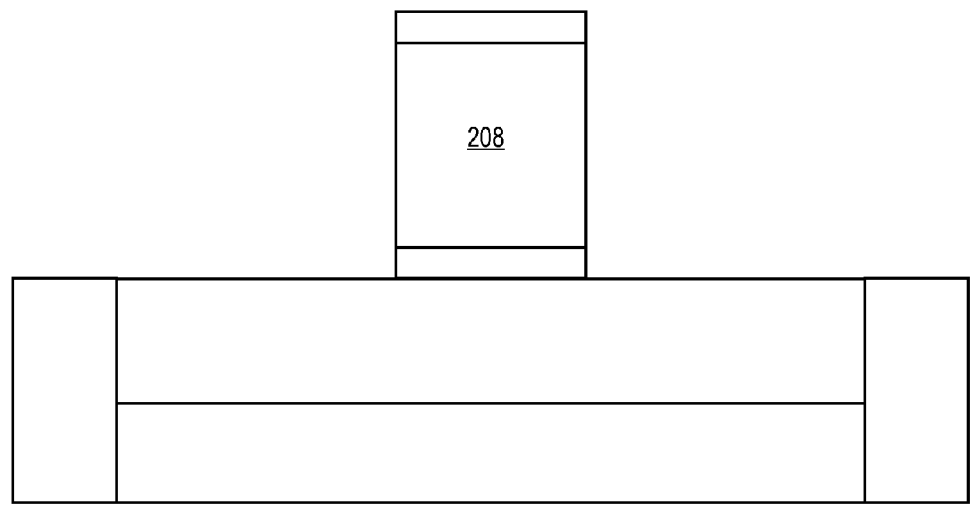

In the case where sacrificial gate isolation spacers 222 were employed to protect gate electrode 208 during the formation of trench 228 and/or during the deposition of active region 204, these spacers may be removed following the deposition of active region 204, as depicted in FIG. 2F. In accordance with an embodiment of the present invention, sacrificial gate isolation spacers 222 are removed to enable the optimization of the tip implant step discussed below. In one embodiment, sacrificial gate isolation spacers 222 are removed with a wet chemical cleaning process step that comprises the application of an aqueous solution of hydrofluoric acid, ammonium fluoride or both to expose the sidewalls of gate electrode 208.

Figure 2G:
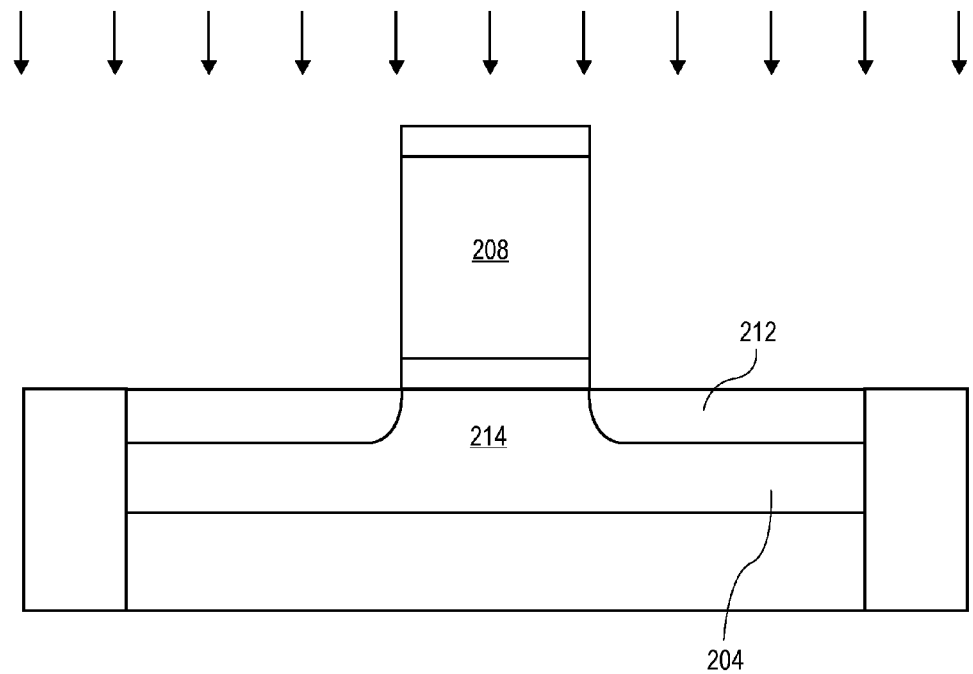

Referring to FIG. 2G, a pair of tip extensions 212 may be formed by implanting charge-carrier dopant impurity atoms into active region 204. The pair of tip extensions 212 may be formed from any of the charge-carrier dopant impurity atoms discussed in association with the pair of tip extensions 112 from FIG. 1B. In accordance with an embodiment of the present invention, gate electrode 208 acts to mask a portion of active region 204, forming self-aligned tip extensions 212. By self-aligning tip extensions 212 with gate electrode 208, channel region 214 may be formed in the portion of active region 204 that is underneath gate electrode 208 and gate dielectric layer 206, as depicted in FIG. 2G. In one embodiment, the charge carrier dopant impurity atoms implanted to form the pair of tip extensions 212 are of opposite conductivity to channel region 214. In a specific embodiment, the pair of tip extensions 212 is formed by implanting charge-carrier dopant impurity atoms with an energy in the range of 0.2 keV-10 keV at a dose in the range of 5E14 atoms/$cm^2$-5E15 atoms/$cm^2$ to form a dopant concentration in the range of 1E20 atoms/$cm^3$-1E21 atoms/$cm^3$ and to a depth in the range of 5-30 nanometers. In order to activate the charge carrier dopant impurity atoms implanted active region 204 to form the pair of tip extensions 212, any suitable annealing technique may be used. In accordance with an embodiment of the present invention, the annealing technique employed to cause the charge carrier dopant impurity atoms of the pair of tip extensions 212 to become substitutionally incorporated into the atomic lattice of active region 204 is selected from the group consisting of thermal annealing, laser annealing or flash annealing.

Figure 2H:
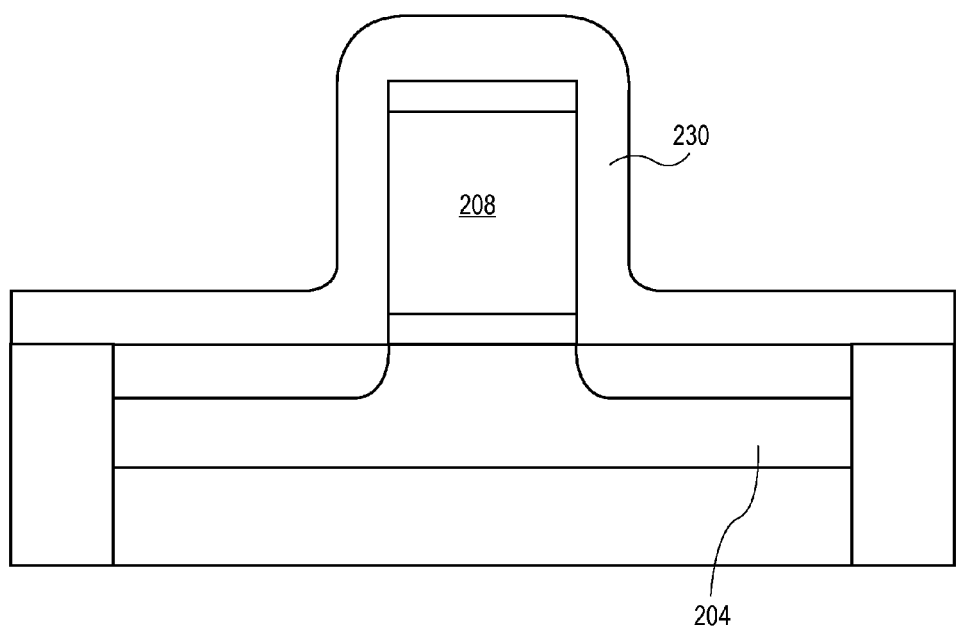

A pair of gate isolation spacers may then be formed. In one embodiment, referring to FIG. 2H, a dielectric material layer 230 is deposited by a chemical vapor deposition process and is conformal with the sidewalls of gate electrode 208 and the top surface of active region 204. Dielectric material layer 230 may be comprised of any of the materials discussed in association with the pair of gate isolation spacers 118 from FIG. 1B. Dielectric material layer 230 may be deposited to a thickness selected to determine the final width of the pair of gate isolation spacers.

Figure 2I:
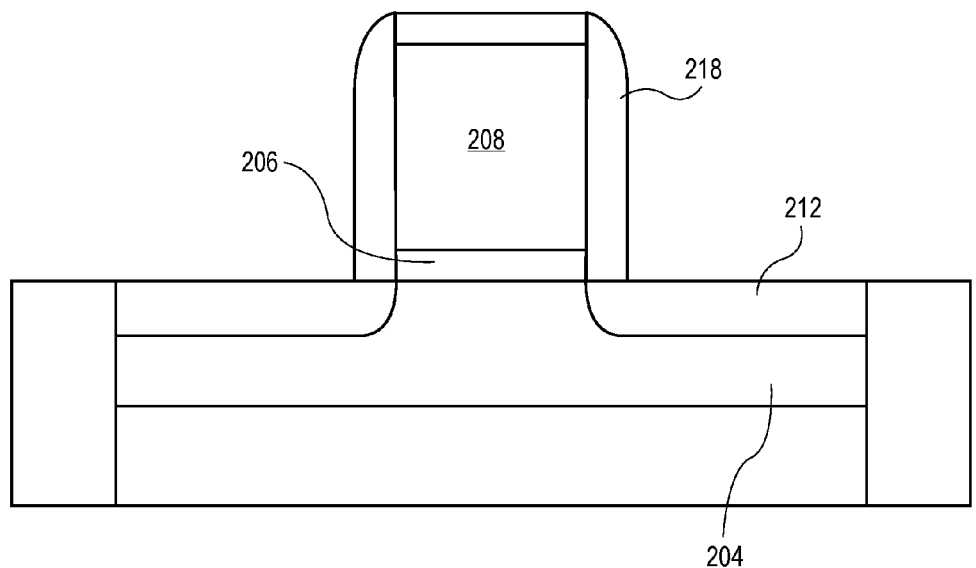

Referring to FIG. 2I, a pair of gate isolation spacers 218 may be formed from dielectric material layer 230 by an anisotropic etch process. In one embodiment, dielectric material layer 230 is dry etched by a remote plasma etch or a reactive ion etch process. In another embodiment, dielectric material layer 230 is patterned to form the pair of gate isolation spacers 218 by using a vertical dry or plasma etch process comprising fluorocarbons of the general formula $C_xF_y$, where x and y are natural numbers. The pair of gate isolation spacers 218 may sit above the top surface of active region 204 and may have a width at the top surface of active region 204 substantially equal to the original thickness of dielectric material layer 230. In accordance with an embodiment of the present invention, the pair of gate isolation spacers 218 resides above the pair of tip extensions 212, as depicted in FIG. 2I. In one embodiment, the pair of gate isolation spacers 218 forms a hermetic seal with gate electrode 208 and the top surface of active region 204 to encapsulate gate dielectric layer 206.

Figure 2J:
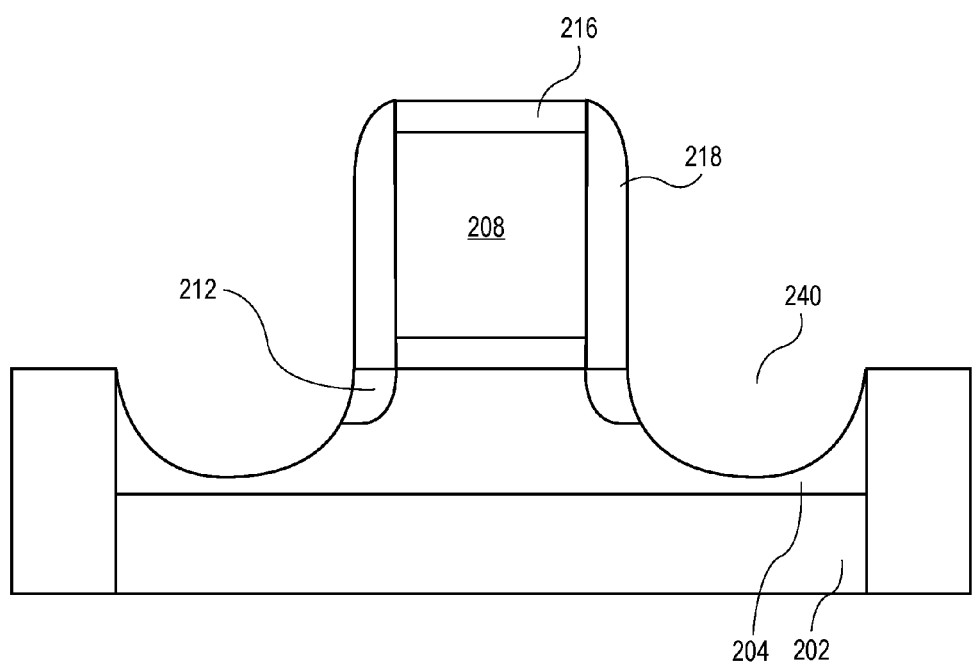

The structure described in association with FIG. 2I may then undergo typical process steps to complete the formation of a MOS-FET, such as an implant step to form a pair of source/drain regions in active region 204 and a silicidation step. Alternatively, strain-inducing source/drain regions may be formed in active region 204. Referring to FIG. 2J, a pair of etched-out regions 240 is formed in active region 204 and are aligned with the outer surfaces of the pair of gate isolation spacers 218, leaving protected the portions of the pair of tip extensions 212 that are underneath the pair of gate isolation spacers 218. In one embodiment, gate electrode protection layer 216 protects gate electrode 212 during the formation of etched-out regions 240. In accordance with an embodiment of the present invention, etched-out regions 240 are formed to a depth such that substrate 202 is not exposed and in the range of 600-1100 Angstroms. In a specific embodiment, portions of active region 204 are removed isotropically, leaving etched-out regions 240 with curvature, as depicted in FIG. 2J. In another embodiment, a wet etch step utilizing aqueous solutions of $NH_4OH$ or tetramethylammonium hydroxide is used to form etched-out regions 240. In one embodiment, these wet etchants are inhibited by high density planes of active region 204, and the etched-out regions 240 thus assume a tapered profile. For illustrative purposes, however, the curved etched-out regions 240 of FIG. 2J are shown in subsequent steps.

A strain-inducing source/drain region formed in an etched-out portion of a crystalline semiconductor material may impart a uniaxial strain to the channel region of the crystalline semiconductor material. In turn, the crystalline semiconductor material may impart a uniaxial strain to the strain-inducing source/drain region. In one embodiment, the lattice constant of the strain-inducing source/drain regions is smaller than the lattice constant of the crystalline semiconductor material and the strain-inducing source/drain regions impart a tensile uniaxial strain to the crystalline semiconductor material, while the crystalline semiconductor material imparts a tensile strain to the strain-inducing source/drain regions. Thus, when the lattice constant of a strain-inducing source/drain region that fills an etched-out portion of a crystalline semiconductor material is smaller than the lattice constant of the crystalline semiconductor material, the lattice-forming atoms of the strain-inducing source/drain region are pulled apart (i.e. tensile strain) from their normal resting state and hence induce a tensile strain on the crystalline semiconductor material as they attempt to relax. In another embodiment, the lattice constant of the strain-inducing source/drain regions is larger than the lattice constant of the crystalline semiconductor material and the strain-inducing source/drain regions impart a compressive uniaxial strain to the crystalline semiconductor material, while the crystalline semiconductor material imparts a compressive strain to the strain-inducing source/drain regions. Thus, when the lattice constant of a strain-inducing source/drain region that fills an etched-out portion of a crystalline semiconductor material is larger than the lattice constant of the crystalline semiconductor material, the lattice-forming atoms of the strain-inducing source/drain region are pushed together (i.e. compressive strain) from their normal resting state and hence induce a compressive strain on the crystalline semiconductor material as they attempt to relax.

Figure 2K:
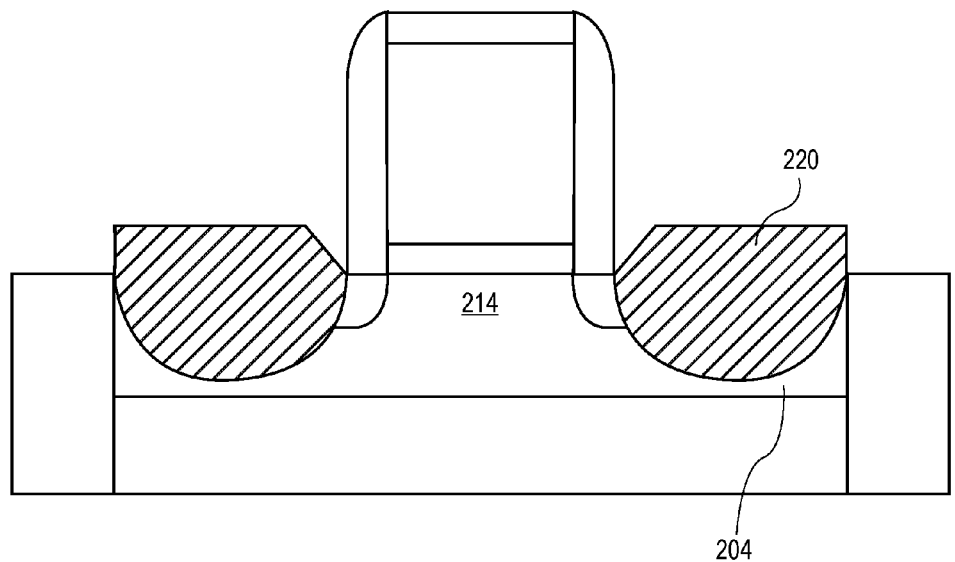

Therefore, referring to FIG. 2K, a pair of source/drain regions 220 is formed in etched-out regions 240. The pair of source/drain regions 220 may be comprised of any material discussed in association with the pair of source/drain regions 120 from FIG. 1B. Additionally, in accordance with an embodiment of the present invention, the pair of source/drain regions 220 have a composition different from the composition of the semiconductor material of active region 204 and impart a uniaxial strain to channel region 214. The pair of source/drain regions 220 may be formed by any technique suitable to form a highly uniform (i.e. low surface defect density, e.g. less than $10^6$ dislocations/$cm^2$ at the surface of the pair of source/drain regions 220) crystalline layer. In one embodiment, the pair of source/drain regions 220 comprises a uniform epitaxial layer. In another embodiment, the pair of source/drain regions 220 comprises a graded epitaxial layer, wherein the grading process minimizes surface defects. In an embodiment, the pair of source/drain regions 220 is deposited by a process selected from the group consisting of chemical vapor epitaxy, molecular-beam epitaxy or laser-abolition epitaxy. In one embodiment, a wet chemical clean is carried out immediately prior to the deposition of the pair of source/drain regions 220. In a specific embodiment, the wet chemical cleaning process step comprises the application of an aqueous solution of hydrofluoric acid, ammonium fluoride or both. The pair of source/drain regions 220 may incorporate charge-carrier dopant impurity atoms. In one embodiment, the pair of source/drain regions 220 is a crystalline silicon/germanium region of the stoichiometry $Si_xGe_{1-x}$, where $0 \leq x \leq 1$, and the charge-carrier dopant impurity atoms are selected from the group consisting of boron, arsenic, indium or phosphorus. In another embodiment, the pair of source/drain regions 220 is comprised of a III-V material and the charge-carrier dopant impurity atoms are selected from the group consisting of carbon, silicon, germanium, oxygen, sulfur, selenium or tellurium. The charge-carrier dopant impurity atoms may be incorporated into the pair of source/drain regions 220 at the same time as the formation of the pair of source/drain regions 220 (i.e. in situ) or as a post ion-implantation step.

Figure 2L:
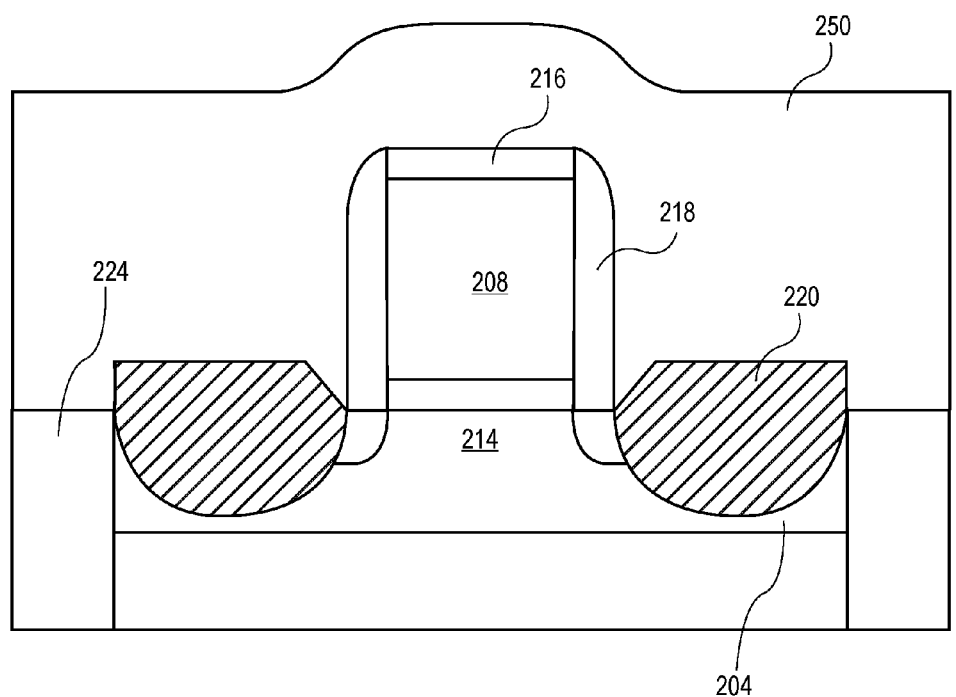
Figure 2M:
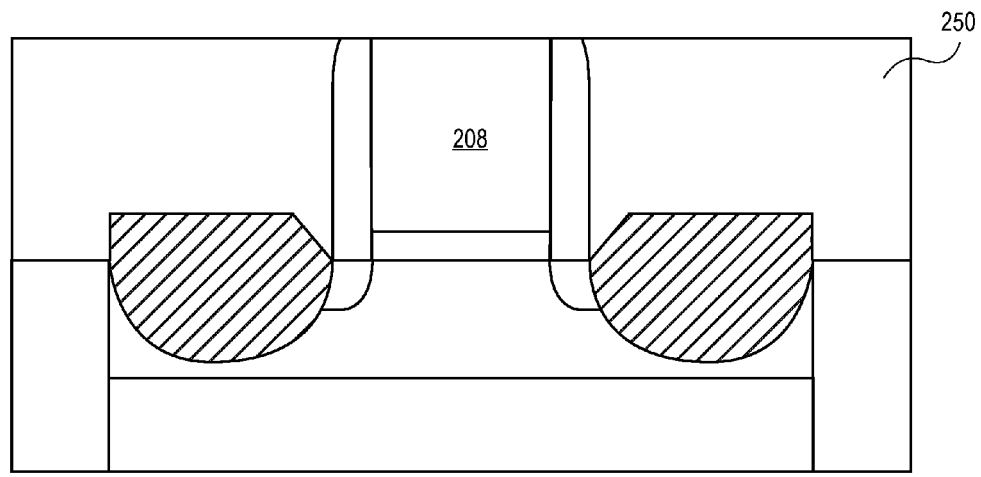
Figure 2N:
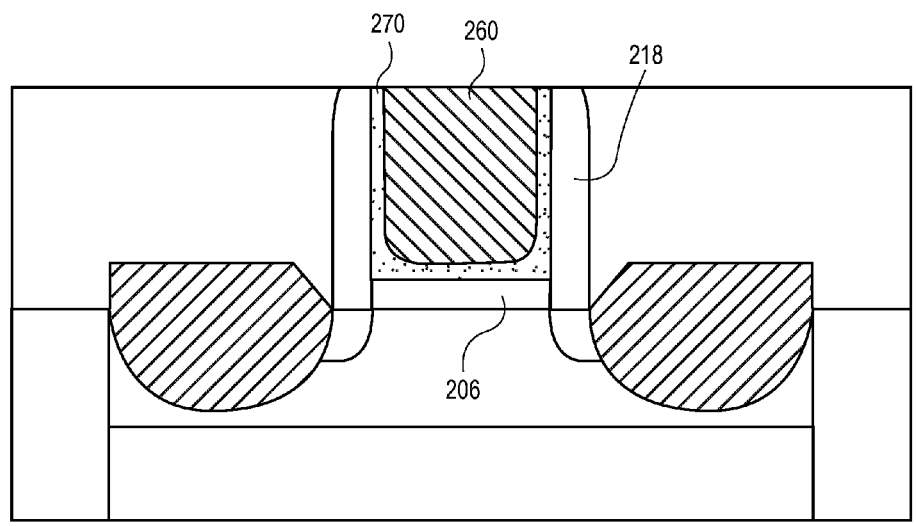

The structure described in association with FIG. 2K may then undergo typical process steps to complete the formation of a MOS-FET, such as a silicidation step. Alternatively, subsequent to the formation of the pair of source/drain regions 220, process steps compatible with a replacement gate process scheme may be carried out. In accordance with an embodiment of the present invention, an interlayer dielectric layer 250 (e.g. a layer of silicon dioxide) is formed over the pair of source/drain regions 220, shallow-trench isolation regions 224, the pair of gate isolation spacers 218 and gate electrode protection layer 216 and/or gate electrode 208, as depicted in FIG. 2L. The interlayer dielectric layer 250 may then be polished back and the gate electrode protection layer 216 removed with a chemical-mechanical polish step to reveal gate electrode 208, as depicted in FIG. 2M. In one embodiment, gate electrode protection layer 216 acts as a polish-stop layer and a wet etch process is subsequently used to remove gate electrode protection layer 216 in order to reveal the top surface of gate electrode 208.

Referring to FIG. 2N, gate electrode 208 may be removed and replaced with an alternative gate electrode 260. In accordance with an embodiment of the present invention, alternative gate electrode 260 is comprised of any material described in association with conductive region 108 from FIGS. 1A-B. Additionally, subsequent to the removal of gate electrode 208 and prior to the replacement with alternative gate electrode 260, an additional dielectric layer 270 may be added to gate dielectric layer 206. In accordance with an embodiment of the present invention, additional dielectric layer 270 may be comprised of any material discussed in association with upper layer 106B from FIG. 1B. The additional dielectric layer 260 may be formed by an atomic layer or chemical vapor deposition process and may therefore also form on the inner walls of the pair of gate isolation spacers 218, as depicted in FIG. 2N.

Thus, referring to FIG. 2N, a planar MOS-FET comprising an active region with a compatible gate dielectric layer may be formed. The planar MOS-FET may be an N-type or a P-type semiconductor device and may be incorporated into an integrated circuit by conventional processing steps, as known in the art. As will be appreciated in the typical integrated circuit, both N- and P-channel transistors may be fabricated in a single substrate or epitaxial layer to form a CMOS integrated circuit.

The present invention is not limited to the formation of planar MOS-FETs comprising active regions with compatible gate dielectric layers. For example, devices with a three-dimensional architecture, such as tri-gate devices, may benefit from the above process. As an exemplary embodiment in accordance with the present invention, FIGS. 3A-C illustrate cross-sectional views representing the formation of a tri-gate MOS-FET having active regions with compatible dielectric layers.

Referring to FIG. 3A, the foundation of a single substrate tri-gate MOS-FET 300 is formed. Tri-gate MOS-FET 300 is comprised of a three-dimensional substrate 302. Three-dimensional substrate 302 may be formed from any material described in association with substrate 102 from FIGS. 1A-B. A gate dielectric layer 306 is formed around three-dimensional substrate 302. Gate dielectric layer 306 may be formed from any material described in association with dielectric layer 106, lower layer 106A and upper layer 106B from FIGS. 1A-B. A gate electrode 308 is formed above gate dielectric layer 306. Gate electrode 308 may be formed from any material described in association with conductive region 108 from FIGS. 1A-B. Gate dielectric layer 306 and gate electrode 308 may be protected by a pair of gate isolation spacers 318.

Figure 3C:
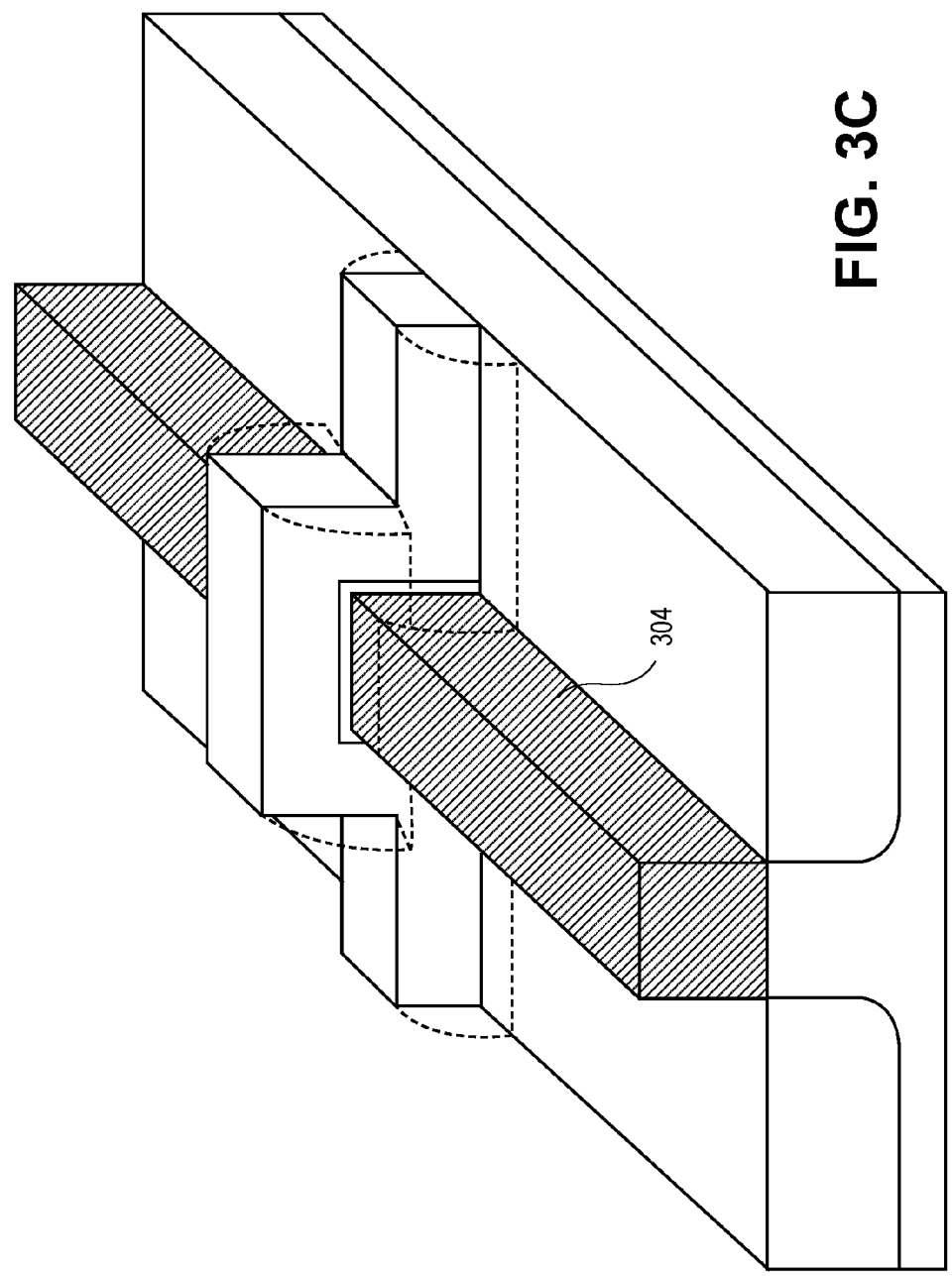

Referring to FIG. 3B, a portions of three-dimensional substrate 302 may be removed to form trench 328. Trench 328 may be formed by any technique described in association with the formation of trench 228 from FIGS. 2D and 2D'. Referring to FIG. 3C, three-dimensional active region 304 is formed selectively in trench 328 and on the remaining portion of three-dimensional substrate 302. Thus, a method to form a tri-gate MOS-FET device comprising an active region with a compatible gate dielectric layer has been described. The tri-gate MOS-FET may be incorporated into an integrated circuit by conventional processing steps, as known in the art.

Thus, a method to form a semiconductor structure with an active region and a compatible dielectric layer has been disclosed. In one embodiment, a semiconductor structure has a dielectric layer comprised of an oxide of a first semiconductor material, wherein a second (and compositionally different) semiconductor material is formed between the dielectric layer and the first semiconductor material. In another embodiment, a portion of the second semiconductor material is replaced with a third semiconductor material in order to impart uniaxial strain to the lattice structure of the second semiconductor material.

What is claimed is:

1. A semiconductor device, comprising:
 a crystalline silicon substrate;
 a germanium region disposed within the silicon substrate;
 a silicon oxide gate dielectric layer disposed directly on the germanium region;
 a metal gate electrode disposed above the silicon oxide gate dielectric layer;
 a pair of dielectric sidewall spacers adjacent the gate electrode;
 a high-k gate dielectric layer disposed on the silicon oxide gate dielectric layer directly between the silicon oxide gate dielectric layer and the metal gate electrode, and disposed along sidewalls of the pair of dielectric sidewall spacers directly between the pair of dielectric sidewall spacers and the metal gate electrode;
 a pair of source/drain regions disposed in the germanium region on either side of the gate electrode; and
 a channel region disposed in the germanium region between the pair of source/drain regions.

2. The semiconductor device of claim 1, further comprising:
 a pair of isolation regions disposed in the crystalline silicon substrate on either side of the germanium region.

3. The semiconductor device of claim 2, wherein the pair of isolation regions extend to a depth in the crystalline silicon substrate below a bottommost surface of the germanium region.

4. The semiconductor device of claim 1, further comprising:
 a pair of tip regions disposed in the germanium region on either side of the channel region, between the channel region and the pair of source/drain regions.

5. The semiconductor device of claim 1, wherein the high-k gate dielectric layer is hafnium oxide.

6. The semiconductor device of claim 1, wherein the source/drain regions are raised source/drain regions having an uppermost surface above an uppermost surface of the germanium region.

7. The semiconductor device of claim 6, wherein the source/drain regions have a lattice constant different than the germanium region.

8. A semiconductor device, comprising:
 a crystalline silicon substrate;
 a group III-V material region disposed within the silicon substrate;
 a silicon oxide gate dielectric layer disposed directly on the group III-V material region;
 a metal gate electrode disposed above the silicon oxide gate dielectric layer;
 a pair of dielectric sidewall spacers adjacent the gate electrode;
 a high-k gate dielectric layer disposed on the silicon oxide gate dielectric layer directly between the silicon oxide gate dielectric layer and the metal gate electrode, and disposed along sidewalls of the pair of dielectric sidewall spacers directly between the pair of dielectric sidewall spacers and the metal gate electrode;
 a pair of source/drain regions disposed in the group III-V material region on either side of the gate electrode; and
 a channel region disposed in the group III-V material region between the pair of source/drain regions.

9. The semiconductor device of claim 8, further comprising:
a pair of isolation regions disposed in the crystalline silicon substrate on either side of the group III-V material region.

10. The semiconductor device of claim 9, wherein the pair of isolation regions extend to a depth in the crystalline silicon substrate below a bottommost surface of the group III-V material region.

11. The semiconductor device of claim 8, further comprising:
a pair of tip regions disposed in the group III-V material region on either side of the channel region, between the channel region and the pair of source/drain regions.

12. The semiconductor device of claim 8, wherein the high-k gate dielectric layer is hafnium oxide.

13. The semiconductor device of claim 8, wherein the source/drain regions are raised source/drain regions having an uppermost surface above an uppermost surface of the group III-V material region.

14. The semiconductor device of claim 13, wherein the source/drain regions have a lattice constant different than the group III-V material region.

15. A non-planar semiconductor device, comprising:
a crystalline silicon lower fin portion;
a germanium upper fin portion disposed on the crystalline silicon lower fin portion;
a silicon oxide gate dielectric layer disposed directly on the germanium upper fin portion;
a metal gate electrode disposed above the silicon oxide gate dielectric layer;
a pair of dielectric sidewall spacers adjacent the gate electrode;
a high-k gate dielectric layer disposed on the silicon oxide gate dielectric layer directly between the silicon oxide gate dielectric layer and the metal gate electrode, and disposed along sidewalls of the pair of dielectric sidewall spacers directly between the pair of dielectric sidewall spacers and the metal gate electrode;
a pair of source/drain regions disposed in the germanium upper fin portion on either side of the gate electrode; and
a channel region disposed in the germanium upper fin portion between the pair of source/drain regions.

16. The non-planar semiconductor device of claim 15, further comprising:
a pair of isolation regions disposed laterally adjacent to the crystalline silicon lower fin portion.

17. The non-planar semiconductor device of claim 15, wherein the high-k gate dielectric layer is hafnium oxide.

18. A non-planar semiconductor device, comprising:
a crystalline silicon lower fin portion;
a group III-V material upper fin portion disposed on the crystalline silicon lower fin portion;
a silicon oxide gate dielectric layer disposed directly on the group III-V material upper fin portion;
a metal gate electrode disposed above the silicon oxide gate dielectric layer;
a pair of dielectric sidewall spacers adjacent the gate electrode;
a high-k gate dielectric layer disposed on the silicon oxide gate dielectric layer directly between the silicon oxide gate dielectric layer and the metal gate electrode, and disposed along sidewalls of the pair of dielectric sidewall spacers directly between the pair of dielectric sidewall spacers and the metal gate electrode;
a pair of source/drain regions disposed in the group III-V material upper fin portion on either side of the gate electrode; and
a channel region disposed in the group III-V material upper fin portion between the pair of source/drain regions.

19. The non-planar semiconductor device of claim 18, further comprising:
a pair of isolation regions disposed laterally adjacent to the crystalline silicon lower fin portion.

20. The non-planar semiconductor device of claim 18, wherein the high-k gate dielectric layer is hafnium oxide.

* * * * *